(12) United States Patent
Kim (10) Patent No.: US 9,983,701 B2
(45) Date of Patent: May 29, 2018

(54) TOUCH PANEL

(71) Applicant: LG INNOTEK CO., LTD., Seoul (KR)

(72) Inventor: Jin Bok Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 270 days.

(21) Appl. No.: 14/518,154

(22) Filed: Oct. 20, 2014

(65) Prior Publication Data

US 2015/0109226 A1    Apr. 23, 2015

(30) Foreign Application Priority Data

Oct. 18, 2013  (KR) .................. 10-2013-0124875

(51) Int. Cl.
*G06F 3/041* (2006.01)
*G06F 3/044* (2006.01)
*H05K 1/11* (2006.01)

(52) U.S. Cl.
CPC .............. *G06F 3/041* (2013.01); *G06F 3/044* (2013.01); *H05K 1/117* (2013.01); *H05K 1/118* (2013.01); *H05K 2201/10128* (2013.01)

(58) Field of Classification Search
CPC ......... G06F 3/041; G06F 3/044; H05K 1/028; H05K 2201/10007; H05K 1/117; H05K 1/118; H05K 2201/10128
See application file for complete search history.

(56) References Cited

U.S. PATENT DOCUMENTS

| | | | |
|---|---|---|---|
| 2011/0043465 A1* | 2/2011 | Huang .................. | G06F 3/045 345/173 |
| 2011/0169783 A1* | 7/2011 | Wang .................. | G06F 3/0412 345/176 |
| 2011/0175841 A1* | 7/2011 | Nakamura ............ | G06F 1/1626 345/173 |
| 2013/0319835 A1* | 12/2013 | Cho ..................... | G06F 3/041 200/295 |

* cited by examiner

*Primary Examiner* — Amr Awad
*Assistant Examiner* — Wing Chow
(74) *Attorney, Agent, or Firm* — KED & Associates, LLP (57) ABSTRACT

A touch panel includes a cover substrate and a substrate over the cover substrate. A first pad part is provided on one surface of the cover substrate and a second pad part is provided on one surface of the substrate. A first distance from an end of the cover substrate to the first pad part is longer than a second distance from the end of the cover substrate to an end of the substrate.

9 Claims, 7 Drawing Sheets

TOUCH PANEL

CROSS-REFERENCE TO RELATED APPLICATION

This application claims priority under 35 U.S.C. § 119 to Korean Application No. 10-2013-0124875 filed on Oct. 18, 2013, whose entire disclosure is hereby incorporated by reference.

BACKGROUND

1. Field

The disclosure relates to a touch panel.

2. Background

A touch window or a touch panel, which performs an input function through the touch of an image displayed on a display device by a finger or an input device such as a stylus pen, has been applied to various electronic appliances. The touch panel may be mainly classified into a resistive touch panel and a capacitive touch panel. In the resistive touch panel, glass is shorted with an electrode due to the pressure of the input device so that a touch point is detected. In the capacitive touch panel, the position of the touch point is detected by detecting the variation in capacitance between electrodes when a finger of the user is touched on the capacitive touch panel.

In the resistive type touch panel, the repeated use thereof may degrade the performance thereof, and cause scratches. Accordingly, there has been greater interest on the capacitive type touch panel having superior endurance and a longer lifespan.

The touch panel according to the related art is manufactured through a scheme of allowing a printed circuit board, such as a flexible printed circuit board (FPCB), on which a driving chip for sensing a touch position based on the variation in capacitance is mounted, to adhere onto a cover substrate or a substrate after a sensing electrode and a wire electrode are formed on the cover substrate or substrate.

In this case, the printed circuit board and the wire substrate are connected to each other through a pad part. The substrate and the cover substrate are formed in mutually different sizes by taking into consideration the adhesion areas of the printed circuit board and the wire electrode. When the cover substrate and the substrate formed in mutually different sizes adhere to each other, a gap may be generated between the substrate and the cover substrate due to the difference in size, so that water or moisture is infiltrated into the inside of the touch panel through the gap, thereby corroding the adhesion area of the printed circuit substrate and the wire substrate.

Therefore, there is a need to provide a touch panel having a new structure.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Referring to FIGS. 1 to 4, the touch panel may include a cover substrate 100, an adhesive layer 200 provided on the cover substrate, a substrate 300 provided on the adhesive layer 200 and a printed circuit board 400 provided on the substrate 300.

The cover substrate 100 may comprise glass or plastic. For example, the cover substrate 100 may include strengthened glass, half-strengthened glass, sodalime glass, strengthened plastic, or flexible plastic. The cover substrate 100 may include an active area AA and an unactive area UA. The active area AA signifies an area through which a touch instruction of a user may be input. In addition, the unactive area UA is opposite to that of the active area AA. The unactive area UA is not activated even if a user touches the unactive area UA, and the unactive area UA signifies an area through which any touch instructions cannot be input.

The substrate 300 may be comprised of plastic, e.g., poly ethylene terephthalate (PET). Similarly to the cover substrate 100, the substrate 300 may include an active area AA and an unactive area UA.

The adhesive layer 200 may be provided between the cover substrate 100 and the substrate 300 to allow the cover substrate 100 to adhere to the substrate 300. The adhesive layer 200 may comprise a transparent adhesive material, e.g., an optically clear adhesive film. The adhesive layer 200 may be disposed at the position corresponding to the substrate 300 such that they may be aligned with each other.

The cover substrate 100 may include a first surface facing the substrate 300 and a second surface opposite to the first surface. A first sensing electrode 510 may be provided on the first surface of the cover substrate 100. The first sensing electrode 510 may be disposed in the active area of the first surface.

The substrate 300 may include a third surface facing the cover substrate 100 and a fourth surface opposite to the third surface. A second sensing electrode 520 may be provided on the fourth surface of the substrate 300. The forth sensing electrode 520 may be disposed in the active area of the fourth surface.

The first and second sensing electrodes 510 and 520 may include a conductive material. For example, the first and second sensing electrodes 510 and 520 may include a transparent conductive material such as indium tin oxide (ITO). The first and second sensing electrodes 510 and 520 may be disposed in mutually different directions while crossing each other. For example, the first sensing electrode 510 may be longitudinally disposed and the second sensing electrode 520 may be traversally disposed. To the contrary, the first sensing electrode 510 may be traversally disposed and the second sensing electrode 520 may be longitudinally disposed.

A wire electrode may be provided on the first surface of the cover substrate. A first wire electrode 610 may be disposed in the unactive area UA of the first surface. One end of the first wire electrode 610 may be connected to the first sensing electrode 510 and drawn out to an upper or low end of the cover substrate 100. A first pad part 710 to be bonded to the printed circuit board 400 may be provided at the opposite end of the first wire electrode 610. The first sensing electrode 510, the first wire electrode 610 and the first pad part 710 may be provided on the first surface of the cover substrate 100.

A wire electrode may be provided on the fourth surface of the substrate 300. In detail, a second wire electrode 620 may be provided in the unactive area of the fourth surface. One end of the second wire electrode 620 is connected to the second sensing electrode 520 and drawn out to the upper or lower end of the cover substrate 100. A second pad part 720 to be bonded to the printed circuit board 400 may be provided at the opposite end of the second wire electrode 620. The second pad part 720 may be spaced apart from the substrate 300 by a predetermined distance. That is, the second sensing electrode 520, the second wire electrode 620 and the second pad part 720 may be disposed on the fourth surface of the substrate 300.

Figure 2:
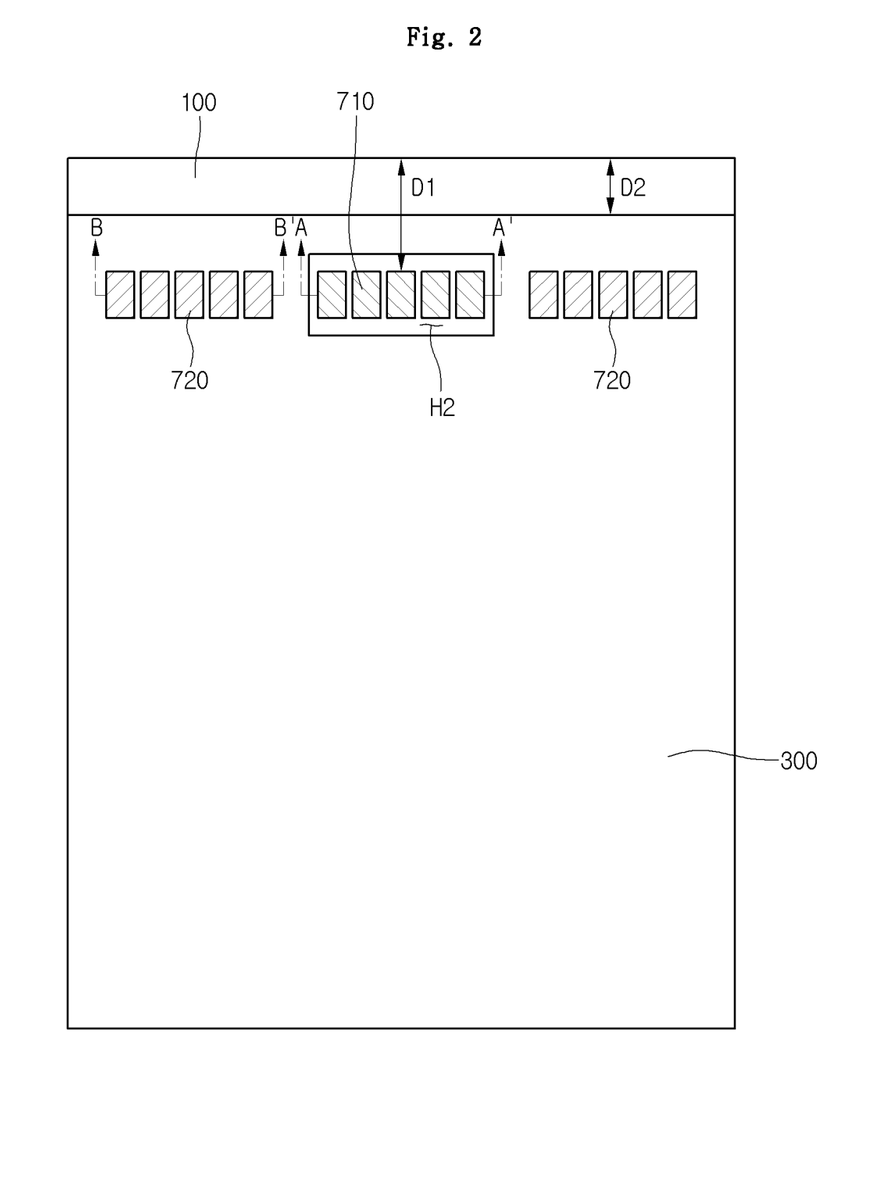
FIG. 2 is a top view showing the touch panel according to the first embodiment in which the cover substrate adheres to the substrate.

As shown in FIG. 2, when a first distance D1 is defined as a distance from the end of an edge of the cover substrate 100 to the first pad part 710 and a second distance D2 is defined as a distance from the end of an edge of the cover substrate 100 to the end of an edge of the substrate 300, the first distance D1 may be different from the second distance D2. The first distance D1 is greater than the second distance D2.

The second distance D2 may be equal to or less than about 200 µm. The end of the substrate 300 may be spaced apart from the end of the cover substrate 100 by about 200 µm or less. In other words, the cover substrate 100 may have a size the same as that of the substrate 300. Thus, the edge surface of the cover substrate 100 may be placed on the same plane as the edge surface of the substrate 300.

When the second distance D2 exceeds 200 µm, water or moisture may be infiltrated into the connecting part of the printed circuit board and the pad part through the gap created due to the step difference formed between the cover substrate 100 and the substrate 300. As a result, the connecting part of the printed circuit part and the pad part may be corroded, leading to the degradation in the reliability of the touch panel.

Figure 1:
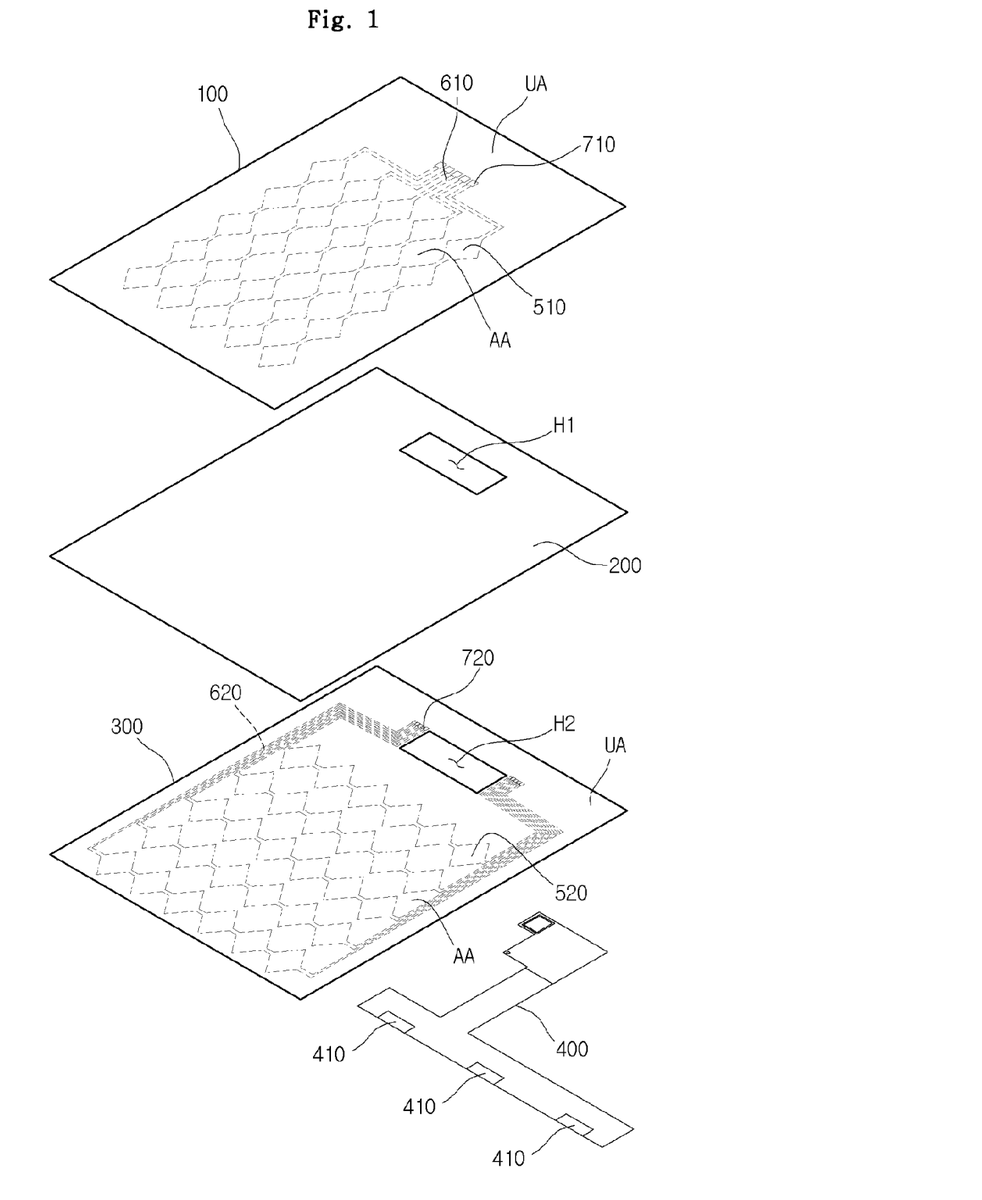
FIG. 1 is an exploded perspective view showing a touch panel according to the first embodiment.
Figure 3:
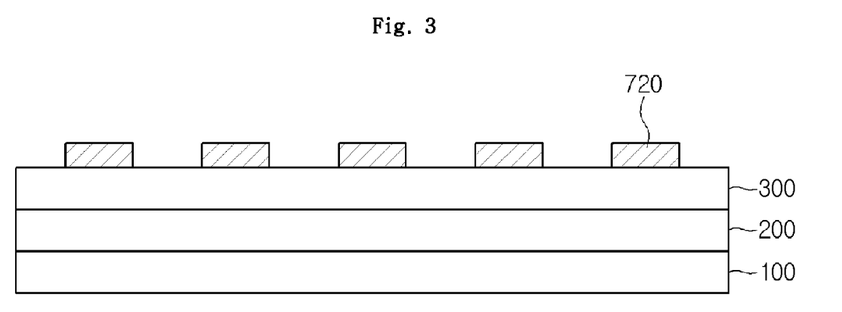
FIG. 3 is a sectional view taken along line B-B' of FIG. 2.
Figure 4:
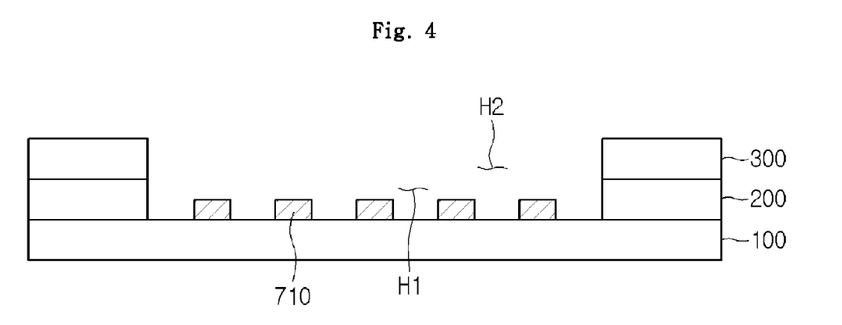
FIG. 4 is a sectional view taken along line A-A' of FIG. 2

The printed circuit board 400 may be disposed on the fourth surface of the substrate 300. For example, the printed circuit board 400 may include a flexible printed circuit board (FPCB). The printed circuit board 400 may be connected to the first pad part 710 and the second pad part 720, respectively. The printed circuit board 400 may include a plurality of connecting parts 410 connected to the first and second pad parts 710 and 720.

Holes may be formed in the adhesive layer 200 and the substrate 300. For example, a first hole H1 may be formed in the adhesive layer 200 and a second hole H2 may be formed in the substrate 300. The first hole H1 may be formed at the position corresponding to that of the second hole H2. The first and second holes H1 and H2 may overlap or align with each other. The first hole H1 may be formed at the position corresponding to that of the first pad part 710 disposed on the first surface of the cover substrate 100. Further, the second hole H2 may be formed at the position corresponding to those of the first pad part 710 and the first hole H1. See FIG. 4.

The first pad part 710, and the first and second holes H1 and H2 may be disposed at the position at which the first pad part 710 and the first and second holes H1 and H2 overlap or align with each other. The first pad part 710 may be exposed to the fourth surface of the substrate 300 through the first and second holes H1 and H2. The printed circuit board 400 may be disposed on the fourth surface of the substrate 300, so that the printed circuit board 400 may be connected to the second pad part 720 disposed on the fourth surface of the substrate and the first pad part 710 exposed through the first and second holes H1 and H2.

The touch panel according to the first embodiment may prevent impurities such as moisture from being infiltrated into a connecting area where the first pad part provided on the cover substrate is connected to the printed circuit board. Since the printed circuit board is disposed on the bottom surface of the substrate (the fourth surface of the substrate and connected to the first and second pad parts when the printed circuit board adheres between the cover substrate and the substrate), the cover substrate and the substrate may be prevented from being delaminated from each other due to the step differences formed among the printed circuited board, the substrate and the cover substrate. When the printed circuit board is disposed after the cover substrate adheres to the substrate, impurities may be prevented from being infiltrated into the connecting part between the printed circuit board and the pad part due to the delamination between the cover substrate and the substrate.

In addition, the cover substrate and the substrate may be disposed such that the distance from the end of the substrate to the end of the cover substrate may be equal to or less than about 200 µm. Since the cover substrate and the substrate may be substantially disposed in the same size so that the step difference generated between the cover substrate and the substrate may be minimized, impurities may be prevented from being infiltrated into the first pad part through the step difference and the holes. According to the touch panel of the first embodiment, impurities may be prevented from being infiltrated into the connecting part of the pad part and the printed circuit board such that the reliability and the durability of the touch panel may be improved.

A touch panel according to the second embodiment will be described with reference to FIGS. 5 to 8. In the description of the touch panel according to the second embodiment, the descriptions about the parts which are similar to or the same as those of the touch panel according to the first embodiment described above will be omitted and the same reference numerals will be assigned to the same components.

The touch panel may include a cover substrate 100, a substrate 300 and a printed circuit board 400.

The cover substrate 100 may include a first surface facing the substrate 300 and a second surface opposite to the first surface. A first sensing electrode 510 may be provided on the first surface of the cover substrate 100. In detail, the first sensing electrode 510 may be disposed in the active area of the first surface.

The substrate 300 may include a third surface facing the cover substrate 100 and a fourth surface opposite to the third surface. A second sensing electrode 520 may be provided on the third surface of the substrate 300. In detail, the second sensing electrode 520 may be disposed in the active area of the third surface. The first and second sensing electrodes 510 and 520 may be provided to face each other.

The first and second sensing electrodes 510 and 520 may be disposed in mutually different directions while crossing each other. For example, the first sensing electrode 510 may be longitudinally disposed and the second sensing electrode 520 may be traversally disposed. Alternatively, the first sensing electrode 510 may be traversally disposed and the second sensing electrode 520 may be longitudinally disposed.

A wire electrode may be provided on the first surface of the cover substrate. A first wire electrode 610 may be disposed in the unactive area UA of the first surface. One end of the first wire electrode 610 may adhere to the first sensing electrode 510 and extended to an upper or low end of the cover substrate 100. A first pad part 710 to be bonded to the printed circuit board 400 may be provided at the opposite end of the first wire electrode 610. The first pad part 710 may be exposed to the third surface of the substrate 300 through a hole H3 formed in the adhesive layer 200. The first sensing electrode 510, the first wire electrode 610 and the first pad part 710 may be provided on the first surface of the cover substrate 100.

A wire electrode may be provided on the third surface of the substrate 300. A second wire electrode 620 may be provided in the unactive area of the third surface. One end of the second wire electrode 620 is connected to the second sensing electrode 520 and extended to the upper or low end of the cover substrate 100. A second pad part 720 to be bonded to the printed circuit board 400 may be provided at the opposite end of the second wire electrode 620. The second pad part 720 may be spaced apart from the substrate 300 by a predetermined distance. The second sensing electrode 520, the second wire electrode 620 and the second pad part 720 may be disposed on the fourth surface of the substrate 300. Thus, the first sensing electrode 510, the first wire electrode 610 and the first pad part 710 may be disposed while facing the second sensing electrode 520, the second wire electrode 620 and the second pad part 710, respectively.

Figure 6:
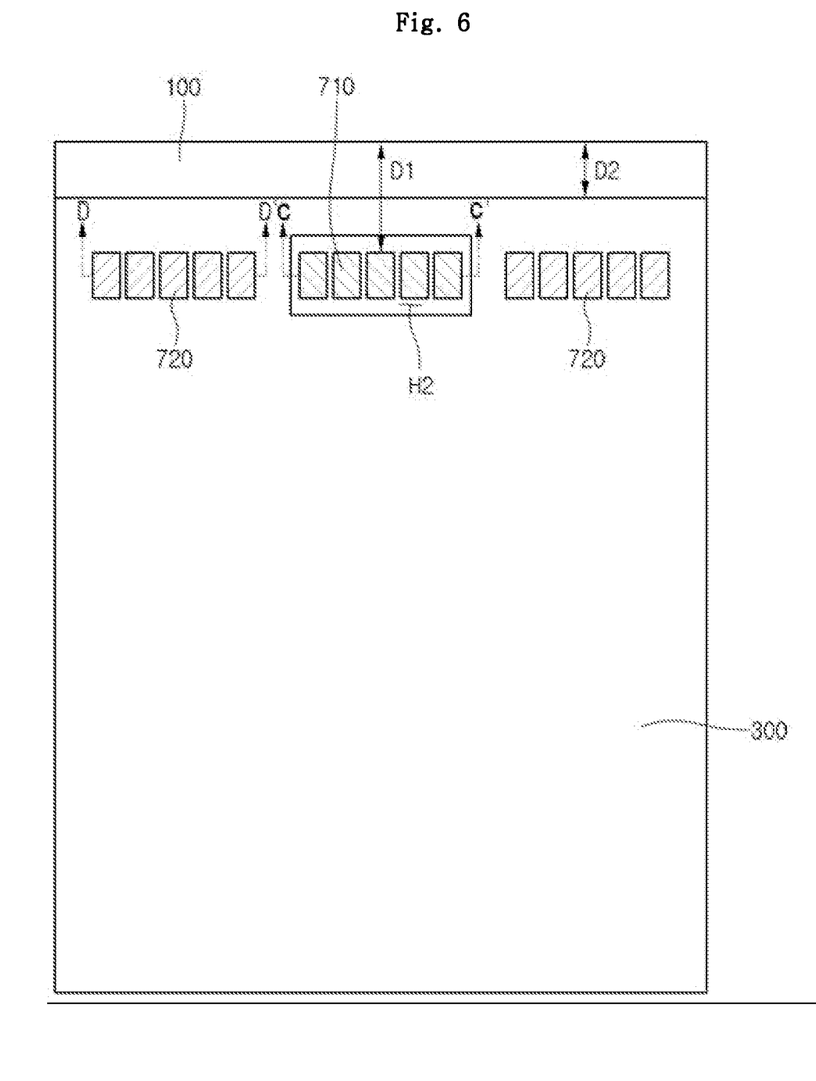
FIG. 6 is a top view showing the touch panel according to the second embodiment in which the cover substrate adheres to the substrate.

As shown in FIG. 6, when a first distance D1 is defined as a distance from an end of the cover substrate 100 to the first pad part 710 and a second distance D2 is defined as a distance from the end of an edge of the cover substrate 100 to the end of an edge of the substrate 300, the first distance D1 may be different from the second distance D2. In detail, the first distance D1 is greater than the second distance D2.

The second distance D2 may be equal to or less than about 200 μm. The end of the substrate 300 may be spaced apart from the end of the cover substrate 100 by about 200 μm or less. In other words, the cover substrate 100 may substantially have a size the same as that of the substrate 300. Thus, the edge surface of the cover substrate 100 may be substantially aligned on the same plane with the edge surface of the substrate 300.

When the second distance D2 exceeds 200 μm, water or moisture may be directly infiltrated into the connecting part of the printed circuit board and the pad part through the gap generated due to the step difference formed between the cover substrate 100 and the substrate 300, so that the connecting part of the printed circuit part and the pad part may be corroded, thereby degrading the reliability of the touch panel.

Figure 5:
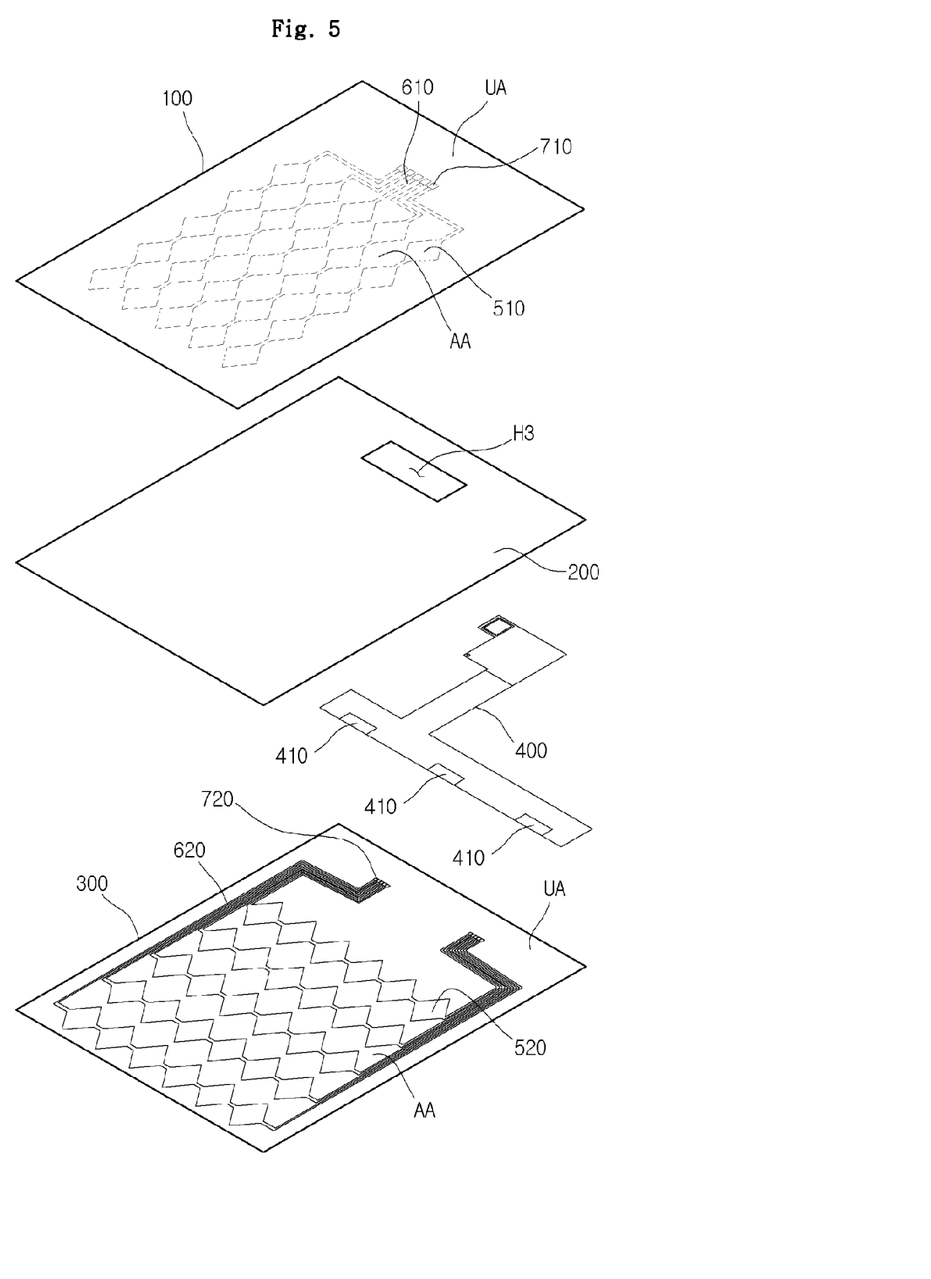
FIG. 5 is an exploded perspective view showing a touch panel according to the second embodiment.
Figure 7:
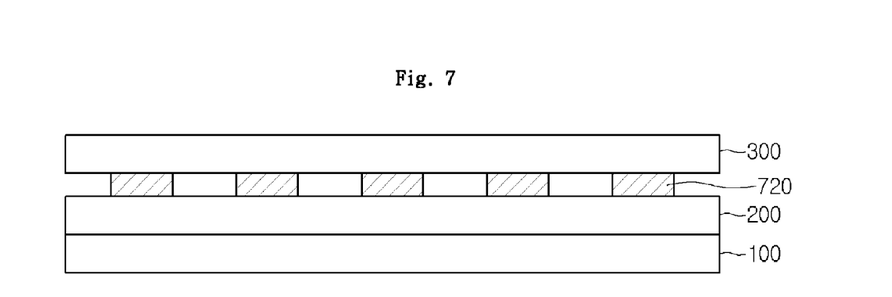
FIG. 7 is a sectional view taken along line D-D' of FIG. 6.
Figure 8:
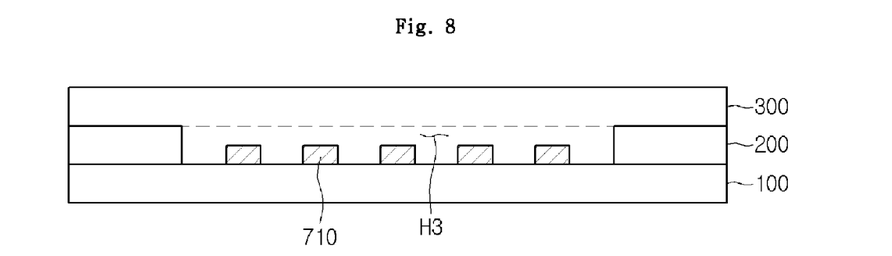
FIG. 8 is a sectional view taken along line C-C' of FIG. 6.

The printed circuit board 400 may be disposed between the cover substrate 100 and the substrate 300. In detail, the printed circuit board 400 may be disposed between the first surface of the cover substrate and the third surface of the substrate. For example, the printed circuit board 400 may include a flexible printed circuit board (FPCB). The printed circuit board 400 may be connected to the first and second pad parts 710 and 720, respectively.

The printed circuit board 400 may be disposed between the cover substrate 100 and the substrate 300 and electrically connected to the first and second pad parts 710 and 720. According to the touch panel of the second embodiment, impurities such as moisture may be prevented from being infiltrated into the connecting part at which the printed circuit board and the pad part are connected to each other.

The cover substrate and the substrate may be disposed such that the distance from the end of the substrate to the end of the cover substrate may be equal to or less than about 200 μm. Since the cover substrate and the substrate may be substantially formed in the same size so that the step difference generated between the cover substrate and the substrate may be minimized, impurities may be prevented from being directly infiltrated into the pad part through the step difference between the cover substrate and the substrate.

According to the touch panel of the second embodiment, impurities may be prevented from being infiltrated into the connecting part of the pad part and the printed circuit board, so that the reliability and the durability of the touch panel may be improved.

Figure 9:
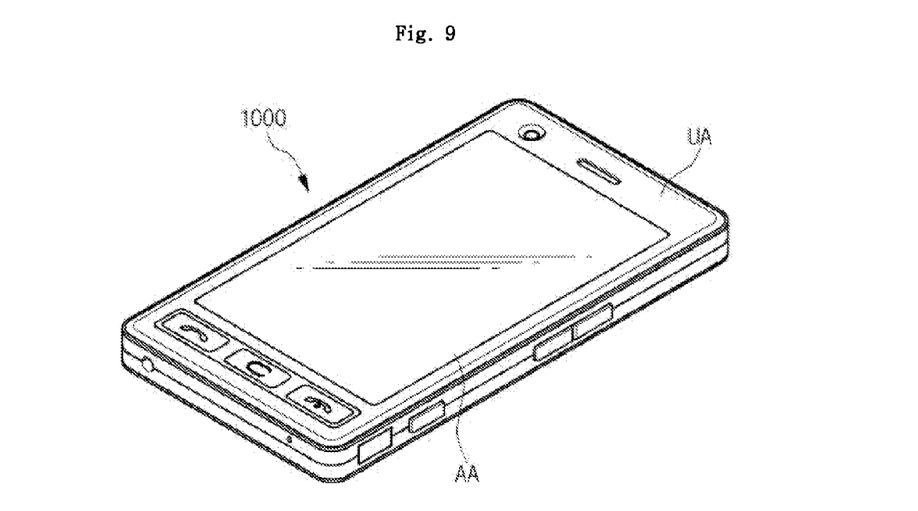
FIGS. 9 and 10 are views showing displays to which the touch panel of the embodiment is applied.
Figure 10:
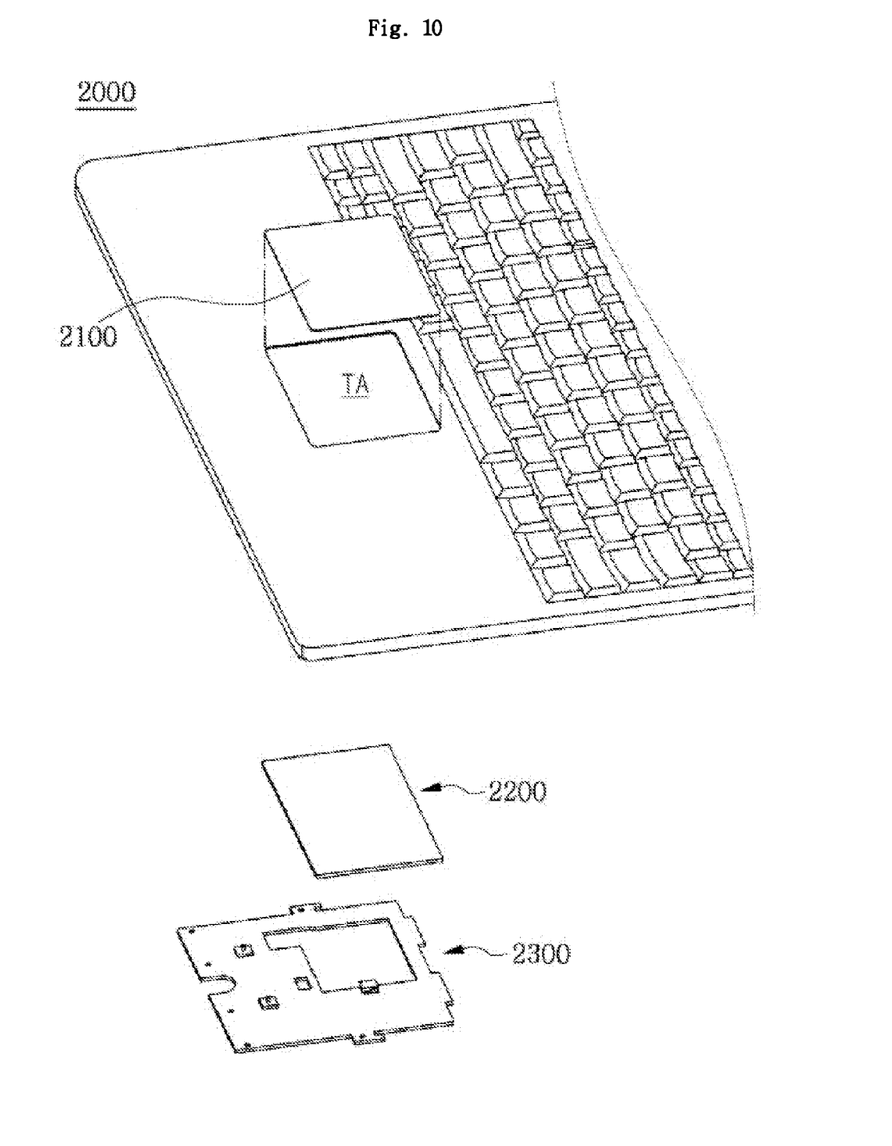

FIGS. 9 and 10 are views showing one example of a display including the touch panel of the first or second embodiment described above.

Referring to FIG. 9, there is depicted a portable terminal as one example of a display. The portable terminal 1000 may include an active area AA and an unactive area UA. A touch signal generated by a touch of a finger may be sensed through the active area may and an instruction icon pattern part and a logo may be formed in the unactive area.

In addition, referring to FIG. 10, there is depicted a laptop computer as one example of a display. The laptop computer may include a touch panel 2200, a touch sheet 2100 and a circuit board 2300. The touch sheet 2100 is disposed on a top surface of the touch panel 2200. The touch sheet may protect a touch area TA. Further, the touch sheet 2100 may improve the touch sensitivity of a user.

The circuit board 230 electrically connected to the touch panel 2200 is provided on a bottom surface of the touch panel 2200. Various kinds of components included in the laptop computer may be mounted on the circuit board 230 which includes a printed circuit board.

Although mobile terminal and the laptop computer are shown in FIGS. 7 and 8 as examples, it should be understood that the touch panels described above may be applied to various electric appliances, such as vehicles or electric home appliances equipped with displays as well as the mobile terminal and the laptop computer.

The embodiment provides a touch panel having improved reliability.

According to the embodiment, there is provided a touch panel including: a cover substrate; a first pad part on one surface of the cover substrate; a substrate on the cover substrate; and a second pad part on one surface of the substrate, wherein a first distance from an end of the cover substrate to the first pad part is longer than a second distance from the end of the cover substrate to an end of the substrate.

According to the touch panel of the embodiment, impurities such as moisture can be protected from being infiltrated into the connecting part at which the printed circuit board and the pad part are connected to each other.

That is, since the printed circuit board is connected to the first and second pad parts in the state that the printed circuit board is provided on the bottom surface of the substrate, when the printed circuit board adheres between the cover substrate and the substrate, the printed circuit board can prevent the cover substrate from being delaminated from the substrate.

Thus, when the printed circuit board is disposed, after the cover substrate adheres to the substrate, impurities can be prevented from being infiltrated into the connecting part of the printed circuit board and the pad part through the gap generated as the cover substrate is delaminated from the substrate.

In addition, since the cover substrate and the substrate are disposed such that the distance from the end of the substrate to the end of the cover substrate is about 200 µm or less, the cover substrate and the substrate can be disposed without any step difference, so impurities can be prevented from being infiltrated into the first pad part through the step difference part and the holes.

Therefore, according to the touch panel of the embodiment, since impurities can be prevented from being infiltrated into the connecting part of the pad part and the printed circuit board, the reliability and the durability of the touch panel can be improved.

It is understood that, when a layer (film), a region, a pattern or a structure is referred to as being "on" or "under" a substrate, another layer (film), region, pad or patterns, it can be "directly" or "indirectly" on the other layer (film), region, pattern or structure, or one or more intervening layers may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A capacitive type touch panel comprising:
a cover substrate including a first surface and a second surface opposite to the first surface;
a plurality of first pad parts on the first surface of the cover substrate;
a substrate on the first surface of the cover substrate and including a third surface that faces the cover substrate and a fourth surface opposite to the third surface;
a printed circuit board provided on the substrate;
a plurality of second pad parts on a surface of the substrate; and
an adhesive layer between the cover substrate and the substrate,
wherein a first distance from an end of the cover substrate to the first pad part is longer than a second distance from the end of the cover substrate to an end of the substrate,
wherein a first hole is formed in the adhesive layer, a second hole is formed in the substrate,
wherein each of the plurality of first pad parts is connected to each of a plurality of first sensing electrodes through each of a plurality of first wire electrodes,
wherein each of the plurality of second pad parts is connected to each of a plurality of second sensing electrodes through each of a plurality of second wire electrodes,
wherein the plurality of first pad parts and the plurality of second pad parts are not overlapped with each other,
wherein the first hole, the second hole, and the plurality of first pad parts are formed at positions corresponding to each other,
wherein an inner area of the first hole and the second hole accommodates the first pad parts,
wherein a total width of the first hole is a same size as a total width of the second hole,
wherein the first sensing electrodes, the first wire electrodes, and the plurality of first pad parts are provided on the first surface of the cover substrate,
wherein the second sensing electrode, the second wire electrode, the plurality of second pad parts, and the printed circuit board are provided on the fourth surface of the substrate, and
wherein the printed circuit board includes:
a plurality of first connecting parts, each of the plurality of first connecting parts facing and being electrically connected to each of the plurality of first pad parts through the first hole and the second hole at the inner area of the first hole and the second hole; and
a plurality of second connecting parts, wherein each of the plurality of second connecting parts facing and being electrically connected to each of the plurality of second pad parts at an area outside of the first hole and the second hole.

2. The capacitive type touch panel of claim 1, wherein the second distance is equal to or less than about 200 µm.

3. The capacitive type touch panel of claim 1, wherein the adhesive layer is provided at a position corresponding to the substrate.

4. The capacitive type touch panel of claim 1, wherein the plurality of first pad parts are exposed through the first hole and the second hole.

5. The capacitive type touch panel of claim 1, wherein the printed circuit board is connected to the plurality of second pad parts disposed on the fourth surface of the substrate and the plurality of first pad parts exposed through the first and second holes.

6. The capacitive type touch panel of claim 1, an edge surface of the cover substrate is placed on a same plane as an edge surface of the substrate.

7. The capacitive type touch panel of claim 1, wherein a total surface area of the first hole and a total surface area of the second hole are each larger than a total surface area of the plurality of first pad parts, and wherein the total surface area of the first hole is the same as the total surface area of the second hole.

8. The capacitive type touch panel of claim 7, wherein the first hole and the second hole have a rectangular shape.

9. The capacitive type touch panel of claim 1, wherein the plurality of second pad parts is provided adjacent to the second hole on the fourth surface of the substrate.

\* \* \* \* \*